United States Patent [19]

Parrillo et al.

[11] Patent Number: 4,722,909
[45] Date of Patent: Feb. 2, 1988

[54] REMOVABLE SIDEWALL SPACER FOR LIGHTLY DOPED DRAIN FORMATION USING TWO MASK LEVELS

[75] Inventors: Louis C. Parrillo; Stephen J. Cosentino; Richard W. Mauntel, all of Austin, Tex.

[73] Assignee: Motorola, Inc., Schaumburg, Ill.

[21] Appl. No.: 780,534

[22] Filed: Sep. 26, 1985

[51] Int. Cl.⁴ ............ H01L 21/265; H01L 21/312; H01L 21/302
[52] U.S. Cl. .................................. 437/34; 437/44; 437/57; 437/913; 437/934; 437/984
[58] Field of Search ................ 29/571, 576 B, 578, 29/579; 148/1.5, DIG. 76, DIG. 106, DIG. 111; 156/643; 357/42; 427/93

[56] References Cited

U.S. PATENT DOCUMENTS

| | | | |
|---|---|---|---|
| 4,422,885 | 12/1983 | Brower et al. | 148/1.5 |
| 4,474,624 | 10/1984 | Matthews | 148/1.5 |
| 4,480,375 | 11/1984 | Cottrell | 29/571 |
| 4,488,348 | 12/1984 | Jolly | 29/571 |
| 4,488,351 | 12/1984 | Momose | 29/578 |
| 4,519,126 | 5/1985 | Hsu | 29/571 |
| 4,525,920 | 7/1985 | Jacobs et al. | 29/571 |
| 4,530,150 | 7/1985 | Shirato | 29/576 B |
| 4,536,944 | 8/1985 | Bracco et al. | 29/576 B |
| 4,561,170 | 12/1985 | Doering et al. | 29/571 |
| 4,577,391 | 3/1986 | Hsia et al. | 29/571 |
| 4,590,663 | 5/1986 | Haken | 29/571 |
| 4,613,882 | 9/1986 | Pimbley et al. | 357/23.3 |

FOREIGN PATENT DOCUMENTS 193371 10/1985 Japan ........................ 29/571

OTHER PUBLICATIONS

Kiyoto Watabe, "LDD Structure Using Polysilicon on Gate Sidewall", presented at 45th Japanese Applied Physics Conference Oct. 12-15, 1984.
Bassous et al., "Self-Aligned Polysilicon Gate MOSFETS with Tailored Source and Drain Profiles", IBM Tech. Discl. Bulletin, vol. 22, #11, 4/80 pp. 5146-5147.
Tsang et al., "Fabrication of High-Performance LDDFET's with Oxide Sidewall-Spacer Technology", IEEE Journal of Solid-State Circuits, vol. SC.-17, #2, 4/82.
Paul J. Tsang et al., "Fabrication of High-Performance LDDFET's with Oxide Sidewall-Spacer Technology," IEEE Journal of Solid-State Circuits, vol. SC-17, No. 2, Apr., 1982, pp. 220-226.

Primary Examiner—Brian E. Hearn
Assistant Examiner—Tom Thomas
Attorney, Agent, or Firm—John A. Fisher; Jeffrey Van Myers; David L. Mossman

[57] ABSTRACT

A method of using removable sidewall spacers to minimize the need for mask levels in forming lightly doped drains (LDDS) in the formation of CMOS integrated circuits. Aluminum or chemical vapor deposition (CVD) metals such as tungsten are suitable materials to form removable sidewall spacers which exist around CMOS gates during heavily doped source/drain region implants. Conformal materials such as CVD polysilicon may also be employed for this purpose. The sidewall spacers are removed before implantation of the lightly doped drain regions around the gates. This implantation sequence is exactly the reverse of what is currently practiced for lightly doped drain formation.

6 Claims, 7 Drawing Figures

REMOVABLE SIDEWALL SPACER FOR LIGHTLY DOPED DRAIN FORMATION USING TWO MASK LEVELS

CROSS-REFERENCE TO RELATED APPLICATION

This application is related to U.S. patent application Ser. No. 780,535, filed on Sept. 26, 1985, which relates to removable sidewall spacers for lightly doped drain formatin using one mask level, abandoned, continued as patent application Ser. No. 47,589, filed on May 11, 1987.

FIELD OF THE INVENTION

The invention concerns the manufacture of CMOS integrated circuits, and more particularly concerns the formation of lightly doped drains (LDDs) during CMOS integrated circuit manufacture.

BACKGROUND OF THE INVENTION

In the formation of fine-lne metal oxide semiconductor (MOS) devices, a recurring and severe problem is hot carrier instability (HCI). This problem occurs due to high electrical fields between the source and the drain, particularly near the drain that cause carriers, either electrons or holes, to be injected into the gate or substrate. The injection of hot carriers into the gate can cause gate oxide charging and threshold voltage instabilities which accumulate over time and greatly degrade device performance.

This problem has been addressed by attempting to reduce the strength of the electric field near the source and the drain regions. One approach concerns using a graded drain structure. For instance, in an n-channel device, a heavily doped drain of phosphorous or arsenic surrounded by a lighter doping of phosphorous is used to gradually extend the drain region into the channel region to reduce the electric field strength right at the drain. However, this approach is undesirable in that it causes larger overlap capacitance with the gate and channel shortening. Merely the deeper junction of the drain produces more disadvantageous short channel effects, such as an abrupt dropoff of threshold voltage with $L_{eff}$.

With deeper junctions, there is a wider subsurface depletion effect and it is easier for the field lines to go from the drain to the source, which causes "punchthrough current" problems and shorts out the device.

A more satisfactory solution to the hot carrier instability problems concerns the use of lightly doped drains (LDDs). LDDs consist of a lightly doped source/drain region that is driven just under the gate region, while the heavily doped drain region is laterally displaced away from the gate by use of a sidewall spacer on the gate. LDDs are particularly advantageous because they do not have problems with large lateral diffusion and the channel length can be set precisely. For a discussion of various approaches to minimizing HCI effects, see E. Takeda, et al. "Submicrometer MOSFET Structure for Minimizing Hot-Carrier Generation," *IEEE Transactions on Electron Devices*, Vol. ED-29, No. 4, April 1982, pp. 611–618.

Lightly doped drains have been studied most extensively in connection with n-channel MOS devices (NMOS) where the HCI problems are most severe. Some limited work has been done on using LDDs with p-channel devices (PMOS) where they provide drain to source punchthrough or short channel protection. For both types of devices the LDD structure has small lateral diffusion under the gate.

The lightly doped regions are implanted after the gate has been etched and prior to sidewall formation. The sidewall spacer is formed by first depositing a dielectric after the gate has been etched and then removing the dielectric from the horizontal regions, namely, the top of the gate, and the source and drain regions, using anisotropic etching, such as reactive ion etching (RIE). This process results in a sidewall spacer left behind on the gate sidewalls that has a roughly quarter-circular cross-section. For a description of this procedure, see Y. Matsumoto, et al. "Optimized and Reliable LDD Structure for lum NMOSFET Based on Substrate Current Analysis," *International Electron Devices Meeting Papers*, Vol. 15.4, 1983, pp. 392–395. See also U.S. Pat. No. 4,356,623, incorporated by reference herein. The spacer is typically a dielectric that remains on the gate sidewall through the final process. After sidewall spacer formation, a heavy source/drain implant is typically done with the gate and spacer acting as masking materials. Consequently, the heavily doped source and drain regions are laterally displaced from the gate edges by the thickness of the sidewall spacer material.

However, to form LDDs on complementary MOS integrated circuits (CMOS) which contain both NMOS and PMOS devices, the obvious technique for putting LDDs on the p-channel and n-channel devices would require the use of four lithographic steps using two different protective resist masks, which is an undesirably large number. The four steps would be an $n^-$ mask after gate etch, a $p^-$ mask, $n^+$ mask (which may be the same as the $n^-$ mask) after the sidewall formation and a $p^+$ mask (which may be the same as the $p^-$ mask). In addition to a large number of masking steps required in this straightforward approach, this technique requires that the $p^-$ region under the spacer of the PMOS gate will receive the same thermal cycle that the $n^-$ region receives at the end of the four implants. This will be deleterious to PMOS transistor behavior in that a large lateral diffusion of $p^-$ region under the gate of the PMOS device will produce short channel effects. In other words, greater underdiffusion, greater overlap capacitance and deeper $p^-$ junctions will occur along with the accompanying short channel effects, etc. Therefore, it would be desirable to provide a technique to incorporate LDDs in both n-channel and p-channel devices on a CMOS structure that requires only one or two mask levels and in addition, that separates the thermal cycles of n-type and p-type source/drain regions.

S. Ratham, et al. in "An Optimized 0.5 Micron LDD Transistor," *International Electron Devices Meeting Papers*, Vol. 10.2, 1983, pp. 237–241, describe a procedure for making LDDs where a lithographed photoresist layer protects the gate during implantation of the heavily doped source/drain regions and is then removed for the implantation of the LDD areas. Even though the protective photoresist mask is removable, the LDD formation step is not a self-aligned one and the number of mask levels required to implement LDDs in CMOS circuits would be undesirably high.

SUMMARY OF THE INVENTION

Accordingly, it is an object of the present invention to provide a technique for forming lightly doped drains in both or either n-channel and p-channel devices in a CMOS integrated circuit.

Another object of the invention is to provide a procedure for the formation of LDDs in CMOS devices which requires only two mask levels and two lithographic steps.

Still another object of the present invention is to provide a method for the formation of LDDs in CMOS devices in which the n-type and p-type source/drain regions may be driven in by separate thermal cycles.

In carrying out these and other objects of the invention, there is provided, in one form, a process for forming LDDs on both NMOS and PMOS devices together on a CMOS integrated circuit involving first forming gates for NMOS and PMOS devices on an integrated circuit substrate. Next, disposable, cleanly removable sidewalls are formed around the gates. Implanting heavily doped source/drain regions around some gates while other gates are protected by a removable barrier material such as photoresist occurs next. The mask levels required concerns this barrier material. The disposable sidewall is next removed from around the gates and the LDD regions are implanted around the gates. Finally, after removal of the barrier material, the source/drain regions are driven in by a thermal drive-in cycle. The process may be repeated for the gates that were shielded, by protecting the source/drain and LDD regions that have been formed so far by means of a second removable barrier material. The LDDs are formed on these gates in a similar fashion by first implanting heavily doped source/drain regions around disposable sidewall spacers around the edges of the previously shielded gates, and subsequently implanting the LDDs after the disposable sidewall spacers are removed.

DETAILED DESCRIPTION OF THE INVENTION

Figure 1:
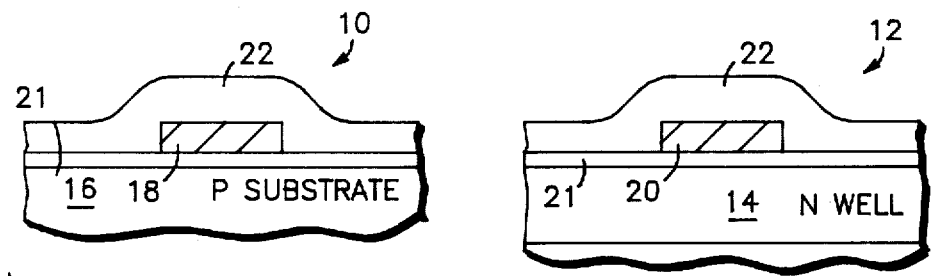
FIGS. 1 through 7 are schematic, cross-sectional illustrations showing the various stages of the process of this invention as LDDs are introduced in the formation of source/drain in NMOS and PMOS devices of a CMOS integrated circuit.

Shows in FIG. 1 is the first step in the formation of the disposable, cleanly etchable sidewall spacers which are a key element of this invention. N-channel device 10 and p-channel device 12 have already been started as seen by the formation of the n-type well 14 in substrate 16. NMOS gate 18 and PMOS gate 20 on gate oxide layer 21 have also already been formed in the portion of the CMOS integrated circuit shown. The details of the formation of gates 18 and 20 and gate oxide layer 21 are not discussed herein as they are not particularly pertinent to the instant invention. It is expected that any kind of MOS gate technology would work in conjunction with this invention. It is also expected tat the invention would work equally well in the instance of p-type wells formed in an n-type substrate or in twin well fabrication procedures. In addition, it is noted that the vertical proportions of the regions, layers and devices relative to the horizontal dimensions are greatly exaggerated for the purpose of clear illustration.

As mentioned, a cleanly etchable sidewall material 22 is formed in a layer over the entire surface of the wafer. In other words, the sidewall material 22 should be capable of being removed without affecting, in a negative way, the previously formed gate oxide or gate material of gates 18 and 20. In addition, the sidewall material should be capable of being removed without appreciably disturbing any existing resist masks, such as by wet etching or isotropic dry etching. To achieve these goals, the sidewall materials proposed here must be cleanly removable, and may be conductive materials, such as metals or dielectric materials. The method of formation is also not critical, as they may be deposited or selectively grown. For example, aluminum or tungsten that is deposited to form the sidewalls, or tungsten that is grown selectively on the gate top and sidewalls would be suitable. Sidewall material 22 must be reasonably conformal to the shape of the gate/substrate interface. For the purposes of this description, "reasonably conformal" simply means that the sidewall material 22 affixes well enough to the edges of gates 18 and 20 in the form of sidewall spacers 24 to perform the masking function during ion implantation of the source/drain regions around the gates. Any cleanly removable chemical vapor deposition (CVD) material would be suitable. Throughout this description, it will be assumed that sidewall material 22 is aluminum for purposes of illustration only, and the invention is not intended to be limited thereby.

Figure 2:
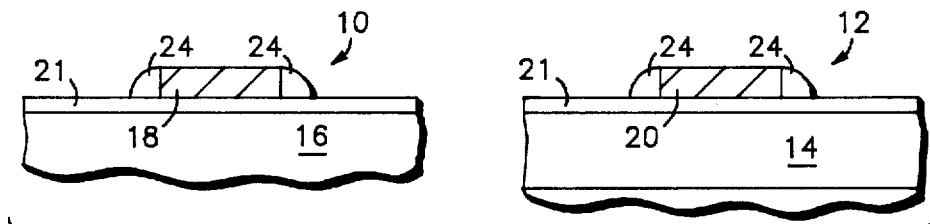

Shown in FIG. 2 are the removable sidewall spacers 24 which are left after the anisotropic etch of the layer of sidewall material 22. If the substance used for sidewall material 22 is not reasonably conformal to the shape of the gates 18 and 20 or cannot be anisotropically etched well, then sidewall spacers 24 will not be optimum. Aluminum deposition is acceptable although a thicker deposited layer would be required which may be undesirable in some circumstances.

Figure 3:
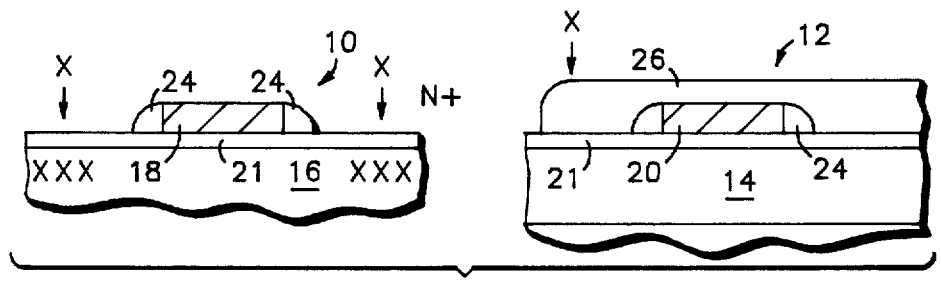

Shown in FIG. 3 is the CMOS circuit under construction, with the PMOS gate 20 protected by first removable barrier material or photoresist layer 26. A mask will be necessary for the application of photoresist layer 26, but as will be noted, this mask is the only one of two required for the process of this invention. The inventive process is not limited by masking the PMOS devices 12 first rather than the NMOS devices 10. The technique described herein could just as easily be applied by masking the NMOS devices 10 first with photoresist layer 26. However, it is preferred that the PMOS devices are masked first so that the PMOS devices will not be subjected to the NMOS device thermal cycle and be possibly degraded by it, causing pronounced short channel effects, at least with conventional processes.

FIG. 3 also shows the implant of the heavily doped $n^+$ regions as represented by the x symbols. The PMOS devices 12 are protected from this implant by first photoresist layer 26 and the future LDD regions around NMOS gates 18 are protected by removable sidewall spacers 24. The implant thus occurs along and around sidewall spacer 24 edges.

Figure 4:
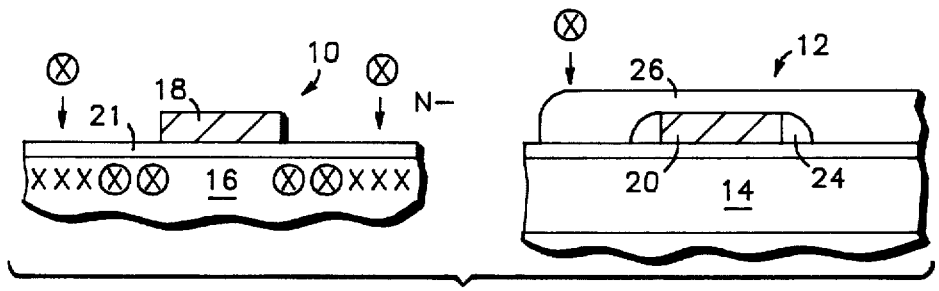

Shown in FIG. 4 are the results of the next steps in the process, which first involves stripping or wet etching the removable sidewall spacers 24 from around the NMOS gates 18. The photoresist layer 26 should remain over the PMOS devices 12 at this point. Next, the lightly doped $n^-$ regions are implanted as represented by the circled x symbols. These $n^-$ regions will self align to the NMOS gate 18 edges.

Figure 4A:
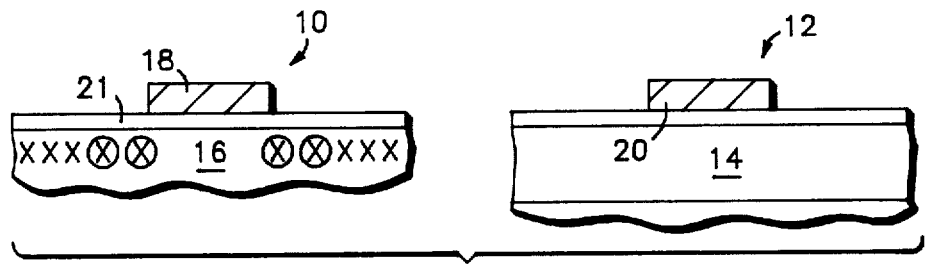
Figure 4B:
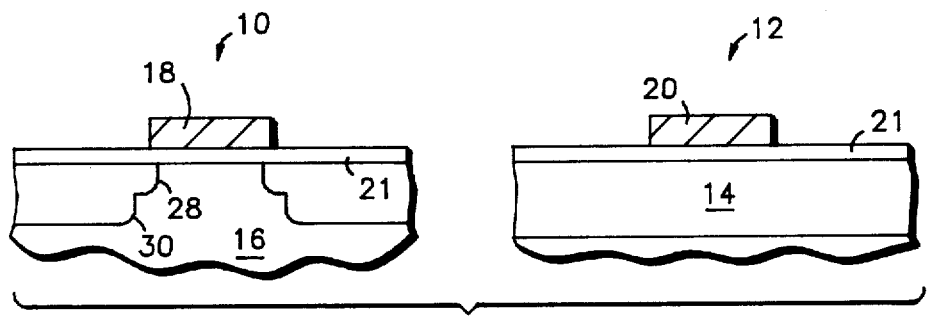

Next, the first photoresist layer 26 is stripped and the remaining removable sidewall spacers 24 around the PMOS gates 20 are removed and the surface of the wafr is cleaned, the results of which are shown in FIG. 4A.

now a thermal drive-in step is performed to drive the n− and n+ regions to appropriate depths. These regions form LDDs 28 and source/drain regons 30, respectively, as shown in FIG. 4B.

Figure 4C:
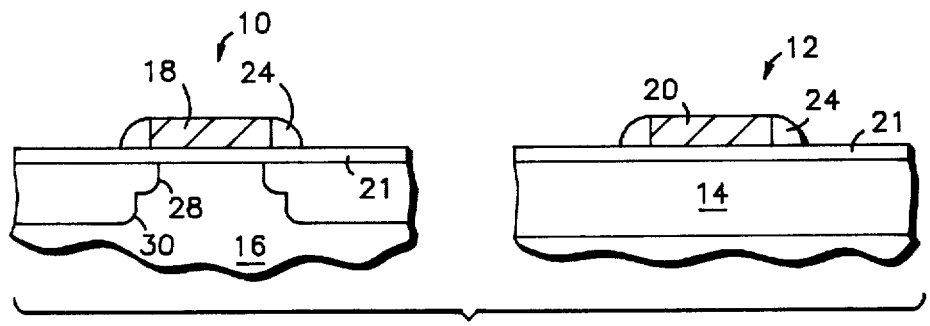
Figure 5:
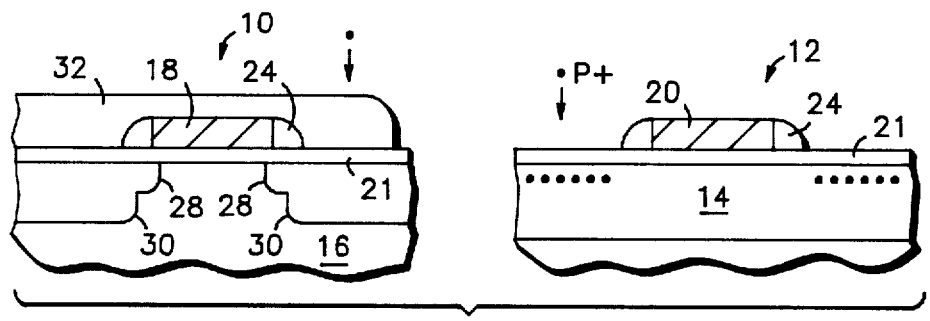

As shown in FIG. 4C, the removable sidewall spacers 24 are reformed on both the NMOS devices 10 and the PMOS devices 12 by the method described previously. As will be recalled, no mask levels are necessary for the formation of these removable sidewall spacers 24. Further, as shown in FIG. 5 second photoresist layer 32 is deposited over the NMOS devices 10 which have already had source/drain regions 30 and LDDs 28 formed therearound. Next, the heavy p+ implant is performed as represented by the dots. Because the NMOS devices 10 are protected by the second photoresist layer 32, the p+ dopants are not implanted into the source/drain regions 30 or NMOS LDDs 28.

Figure 6:
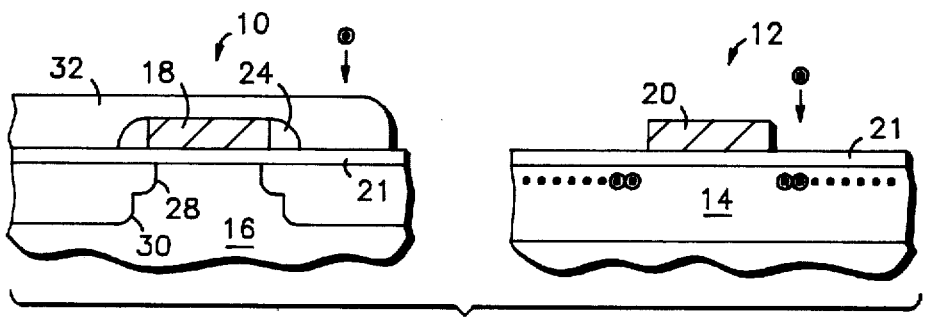

Shown in FIG. 6 are the results of the next steps which include the removal of sidewall spacers 24 by wet etching or isotropic dry etching techniques from around PMOS gates 20. Next, the implant of lightly doped p− regions may be conducted as represented by the circled dots. Once again, the NMOS devices 10 are protected by the second barrier material 32.

Figure 7:
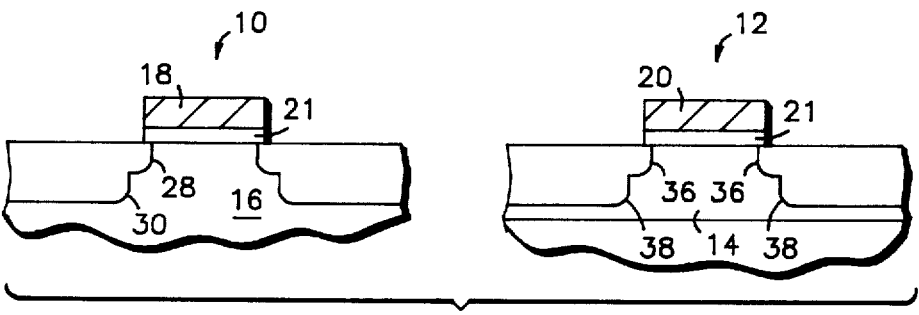

Finally, as shown in FIG. 7, after the stripping of second photoresist layer 32 and the removal of sidewall spacers 24 from around the edges of NMOS gates 18, a second, separate thermal drive-in cycle is performed to activate the p− and p+ regions to form PMOS LDDs 36 and PMOS source/drain regions 38, respectively. The PMOS devices 12 and NMOS devices 10 shown in FIG. 7 are the finished devices as far as the process of this invention is concerned. Of course, other processing, such as the etching of gate oxide layer 21 and the creation of the ohmic contacts must be conducted.

It should be noted that in all of these procedures only two mask levels are used and the donor and acceptor regions are driven in in separate thermal cycles allowing the cycles to be custom tailored as needed to each dopant. These advantages are unexpected in a process for introducing LDDs in CMOS integrated circuits. Of course, all the benefits of employing LDDs discussed previously are also obtained.

We claim:

1. A process for forming lightly doped drains (LDD) on devices in MOS integrated circuits comprising:
    forming gates for MS devices on an integrated circuit substrate, the substrate having a first portion containing first selected gates of devices of a first conductivity type and a second portion containing second selected gates of devices of a second conductivity type, wherein all of the gates have edges;
    forming sidewall spacers along all of the gate edges by depositing and anisotropically etching a layer of cleanly etchable material, the sidewall spacers in turn having edges;
    forming a first barrier covering first selected gates;
    implanting heavily doped source/drain regions along the sidewall spacer edges of the second selected gates, while the first selected gates are protected by the first barrier;
    removing the sidewall spacers from along the edges of the second selected gates, without removing the first barrier;
    implanting LDD regions along the second selected gate edges;
    removing the first barrier;
    removing the sidewall spacers from along the edges of the gates;
    driving in the source/drain regions along the edges of the second selected gates in a first thermal drive-in cycle;
    reforming the removable sidewall spacers along all of the gate edges by redepositing and anisotropically etching a layer of cleanly etchable material;
    forming a second barrier over the second selected gates;
    implanting heavily doped source/drain regions along the sidewall spacer edges of the first selected gates while the second selected gates are protected by a second barrier;
    removing the sidewall spacers from along the edges of the first selected gates, without removing the second barrier;
    implanting LDD regions along the first selected gate edges;
    removing the second barrier;
    removing the sidewall spacers from along the edges of the second selected gates; and
    driving in the source/drain regions along the gate edges of the first selected gates in a second thermal drive-in step.

2. The process of claim 1 in which only two mask levels are employed in the formation of the LDDs.

3. A process for forming lightly doped drains (LDDs) on both NMOS and PMOS devices together on a CMOS integrated circuit comprising:
    forming gates for NMOS and PMOS devices on a thin dielectric layer on an integrated circuit substrate, the substrate having a first portion containing first selected gates of PMOS devices and a second portion containing second selected gates of NMOS devices, wherein all of the gates have edges;
    forming cleanly removable sidewall spacers along all of the gate edges by depositing and anisotropically etching a layer of material different from the thin dielectric layer, wherein the spacers have edges;
    forming a first removable barrier material over the first selected gates;
    implanting heavily doped source/drain regions along sidewall spacer edges of the second selected gates while the first selected gates are protected by the first removable barrier material;
    removing the sidewall spacer from along the edges of the second selected gates, without removing the thin dielectric layer or the first barrier material;
    implanting LDDs along the gate edges of the second selected gates while the first selected gates are protected by the first removable barrier material;
    removing the first barrier material;
    removing the remaining first cleanly removable sidewall spacers;
    driving in the source/drain regions along the second selected gate edges in a first thermal drive-in cycle;
    reforming the cleanly removable sidewall spacers around all of the gate edges by depositing and anisotropically etching a layer of material different from the thin dielectric layer;
    forming a second removable barrier material over the second selected gates;
    implanting heavily doped source/drain regions along sidewall spacer edges of the first selected gates while the second selected gates are protected by a second removable barrier material;

removing the sidewall spacer from along the edges of the first selected gates, without removing the thin dielectric layer or the second barrier material;

implanting LDDs along the first selected gate edges while the second selected gates remain protected by the second removable barrier material;

removing the second barrier material;

removing the sidewall spacer from along the second selected gate edges; and driving in the source/drain regions along the first selected gate edges in a second thermal drive-in cycle.

4. The process of claim 3 in which only two mask levels are employed in forming the LDDs.

5. A process for forming lightly doped drains (LDDs) on both NMOS and PMOS devices together on a CMOS integrated circuit using two mask levels comprising forming gates on a thin dielectric layer for PMOS and NMOS devices on first p portions and second n portions respectively, wherein the PMOS devices have first selected gates and the NMOS devices have second selected gates, further wherein all of the gates have edges;

forming first cleanly removable sidewall spacers along all of the gate edges by depositing and anisotropically etching a layer of material different from the thin dielectric layer, wherein the spacers have edges;

depositing a first photoresist mask over the first selected gates;

implanting heavily doped source/drain regions along the edges of the first sidewall spacers of the second selected gates while the first selected gates are protected by the first photoresist mask;

removing the first sidewall spacers from along the second selected gate edges, without removing the thin dielectric layer or the first barrier material;

implanting LDDs along the gate edges of the second selected gates while the first selected gates are protected by the first photoresist mask;

stripping the first resist mask from the first selected gates;

removing the remaining first sidewall spacers;

driving in the source/drain regions and LDDs along the second selected gate edges in a first thermal drive-in cycle;

reforming second cleanly removable sidewall spacers along all of the gate edges by depositing and anisotropically etching a layer of material different from the thin dielectric layer;

depositing a second resist mask over the second selected gates;

implanting heavily doped source/drain regions along the edges of the second sidewall spacers of the first selected gates;

removing the second sidewall spacers from along the first selected gate edges, without removing the thin dielectric layer or the second barrier material;

implanting LDDs along the first selected gate edges; and stripping the second resist mask from the second selected gates;

removing the remaining second sidewall spacers; and driving in the source/drain regions and LDDs along the first selected gate edges in a second thermal drive-in cycle.

6. A process for forming lightly doped drains (LDDs) on both NMOS and PMOS devices together on a CMOS integrated circuit using one mask level comprising forming gates on a thin dielectric layer for PMOS and NMOS devices on first p portions and second n portions respectively, wherein the PMOS devices have first selected gates and the NMOS devices have second selected gates, further wherein all of the gates have edges;

forming first cleanly removable sidewall spacers along all of the gate edges by depositing and anisotropically etching a layer of material different from the thin dielectric layer, wherein the spacers have edges;

depositing a first photoresist mask over the first selected gates;

implanting heavy doped source/drain regions along the edges of the first sidewall spacers of the second selected gates while the first selected gates are protected by the first photoresist mask;

removing the first sidewall spacers from along the second selected gate edges, without removing the thin dielectric layer or the second barrier material;

implanting LDDs along the gate edges of the second selected gates while the first selected gates are protected by the first photoresist mask;

stripping the first resist mask from the gates;

removing the remaining first sidewall spacers;

driving in the source/drain regions and LDDs along the second selected gate edges in a first thermal drive-in cycle;

reforming second cleanly removable sidewall spacers along all gate edges by depositing and anisotropically etching a layer of material different from the thin dielectric layer;

depositing a second resist mask over the second selected gates;

implanting heavily doped source/drain regions along the edges of the sidewall spacers of the first selected gates;

removing the second sidewall spacers from along the first selected gate edges, without removing the thin dielectric layer or the second barrier material;

implanting LDDs along the first selected gate edges;

stripping the second resist mask from the second selected gates;

removing the remaining second sidewall spacers;

driving in the source/drain regions and LDDs along the first selected gate edges in a second thermal drive-in cycle.

* * * * *

UNITED STATES PATENT AND TRADEMARK OFFICE
CERTIFICATE OF CORRECTION

PATENT NO. : 4,722,909
DATED : February 2, 1988
INVENTOR(S) : Louis Carl Parrillo et al It is certified that error appears in the above-identified patent and that said Letters Patent is hereby corrected as shown below:

In claim 1, column 5, line 48, please change "MS" to --MOS--.

Signed and Sealed this

Twenty-first Day of June, 1988

Attest:

DONALD J. QUIGG

*Attesting Officer*   *Commissioner of Patents and Trademarks*